United States Patent [19]

Cronyn

[11] Patent Number: 5,142,651
[45] Date of Patent: Aug. 25, 1992

[54] UNINTERRUPTED, ENHANCED-RATE, EVENT-TIME RECORDER WITH MIXED-SPEED COUNTER MODULES

[75] Inventor: Willard M. Cronyn, San Diego, Calif.

[73] Assignee: United States of America as represented by the Secretary of the Navy, Washington, D.C.

[21] Appl. No.: 775,678

[22] Filed: Oct. 9, 1991

[51] Int. Cl.$^5$ .................................................. G06F 9/00
[52] U.S. Cl. ........................................ 377/44; 377/26; 377/55
[58] Field of Search .............................. 377/44, 26, 55

[56] References Cited

U.S. PATENT DOCUMENTS

| | | | |
|---|---|---|---|
| 3,805,031 | 4/1974 | Leibowitz et al. | 377/56 |
| 3,982,108 | 9/1976 | Horsley | 377/56 |
| 4,002,926 | 1/1977 | Moyer | 377/47 |
| 4,160,154 | 7/1979 | Jennings | 368/118 |
| 4,195,292 | 3/1980 | Puhich | 377/44 |
| 4,255,793 | 3/1981 | Nakamura | 377/44 |
| 4,477,918 | 10/1984 | Nossen et al. | 377/37 |
| 4,499,589 | 2/1985 | Geesen | 377/52 |
| 4,503,548 | 3/1985 | Phillips | 377/39 |
| 4,517,684 | 5/1985 | Fennel | 377/19 |
| 4,519,091 | 5/1985 | Chu et al. | 377/44 |
| 4,663,770 | 5/1987 | Murray et al. | 377/44 |
| 4,763,342 | 8/1988 | Ambrosio et al. | 377/44 |
| 4,779,215 | 10/1988 | Moisan et al. | 364/569 |
| 4,809,221 | 2/1989 | Magliocco et al. | 377/44 |
| 4,870,664 | 9/1989 | Hayashi | 377/44 |
| 4,912,734 | 3/1990 | Frauenglass | 377/20 |
| 4,914,616 | 4/1990 | Shiraishi et al. | 364/770 |

OTHER PUBLICATIONS

Chu, David; "Phase Digitizing Sharpens Timing Measurements"; pp. 28-32; Jun. 1988; New York, N.Y.

Primary Examiner—Stanley D. Miller
Assistant Examiner—Scott A. Ouellette
Attorney, Agent, or Firm—Harvey Fendelman; Thomas G. Keough; Peter A. Lipovsky

[57] ABSTRACT

An uninterrupted event-time recorder enables high-precision measurements of the time-of-occurrence of randomly- and rapidly-occurring, digitally specified events such as the leading and/or trailing edges of asynchronous pulses. The lowest order binary digits of the recorder are constructed of high-speed synchronous integrated circuit counter devices. For an N-bit timer having M low-order bits, the highest order (N-M) bit counting is executed by two parallel (N-M)-bit slow-speed counters, one of which is incremented by the terminal count of the M-bit high-speed counter and the other which is incremented by the most significant bit (MSb) of the M-bit counter. The (N-M)-bit counters are read out through a multiplexer controlled by the MSb. The terminal count integrated counter is read out from the instant that the MSb goes high and until the MSb goes low (during which time the MSb-incremented counter is settling), while the MSb-incremented counter is read out from the instant that the MSb goes low up until the MSb goes high (during which time the terminal count incremented counter is settling). By utilizing this system real-time capture of event-time is possible with no delays associated with the settling of slow-speed counters. As such there are no cumulative clock count errors.

21 Claims, 7 Drawing Sheets

UNINTERRUPTED, ENHANCED-RATE, EVENT-TIME RECORDER WITH MIXED-SPEED COUNTER MODULES

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1. Field of the Invention

This invention pertains broadly to the field of counter devices. More particularly, the invention pertains to a device for accurately counting rapidly succeeding pulses. In still greater particularity, but without limitation thereto, the invention relates to an event-time recorder for accurately and rapidly capturing the time-of-occurrence of a synchronous or asynchronous train of pulses without the need for counter interrupt.

2. Description of the Related Art

In determining the time-of-occurrence of an event, such as the leading or trailing edge of a pulse, the state of a counter must be ascertained. If, for example, a binary counter is used to capture an event-time at a resolution of four nanoseconds over an interval of 16.8 milliseconds, the counter would need have at least a 22 bit counting capacity (16.8 $msec \div 4$ $nanoseconds = 2^{22}$). A significant time period, however, can be required for a counter to increment by just one count, that is, one clock pulse. For example, in transitioning to the next count from a count corresponding to the 21 lowest order bits set high and the remaining (most significant) bit set low, all 22 bits of the binary counter must change state. If the time (count) is read out of the counter before all bit changes have propagated and the bits have switched state (jointly known as counter settling time), significant counting inaccuracy will result.

There are techniques for avoiding such errors. In one technique, a suspension of counting occurs until all counter bits have settled. This technique results in a "dead time" that creates a loss of count perpetuity, i.e. a loss of maintenance of absolute time, as well as creates a loss of the ability to record events during the "dead time".

Another technique uses a fully synchronized counter chain in which all bits change state within one clock period. Although the read-out of this device will be relatively accurate, this approach requires that each counter module (typically of four-bits) be capable of operation at the full clock rate even though counter transitions will be occurring less and less often for higher order bits (by a factor of 2 from one bit to the next higher bit). Utilizing a high-speed synchronized counter chain to record higher order bits results in greater dollar cost, increased power consumption, enhanced heat dissipation, higher peripheral circuit complexity and greater circuit board area. Further, in such a chain, there are module-to-module delays which result in progressively increasing bit settling times as counter chain links are increased in length. This results in a decreasing of the maximum event frequency at which event times can be recorded.

Another technique incorporates the use of two counters in which one counter is stopped for readout into a second counter which then continues the count. In such a technique errors accumulate due to counter stoppage; and additional event-time recording during counter stoppage is prohibited.

Yet another approach uses a combination of a fast synchronous counter to count low order bits and a slower and therefore less expensive and less power-consuming ripple-through or slow-counter to count high order bits. In this technique read-out of the high order bits is delayed for a preset period whenever there is a carry bit out of the fast counter stages. This delay period, of approximately 100 nanoseconds, depends directly upon the maximum propagation and switching times within the slow counter stages and prevents event times from being recorded during the delay. Furthermore, an enlargement of the slow-speed counter's capacity further prolongs the necessary delay period.

SUMMARY OF THE INVENTION

The invention enables real-time capture of event-time. The event time recorder of the invention permits high-precision measurements of the time-of-occurrence of randomly- and rapidly-occurring events (such as the leading and/or trailing edges of synchronous pulses).

The invention requires that only its lowest order binary digit counters be constructed of high-speed synchronous integrated counter devices. For an N-bit timer having M low order bits, the higher order (N-M) bits can be slow-speed counters provided that the total switching and carry propagation and settling time through the (N-M) bit counter is less than approximately $[2(M-1)]*T$, where T is the clock period. For example, even at a clock frequency of 250 MHz i.e., a clock period of 4 nsec, a 4-bit Emitter-Coupled Logic (ECL) counter would suffice as a front-end "server" for an Advanced Low-Power Schottky (ALS) and other slower-speed TTL-compatible counters.

The (N-M)-bit counting is executed by two parallel (N-M)-bit slow-speed counters, one of which is incremented by a count signal (terminal count pulse) of the M-bit counter and the other of which is increment by a switch signal (the most significant bit (MSb)) of the M-bit counter. When an event occurs, the (N-M)-bit counters are read-out through a multiplexer controlled by the M-bit counter MSb. The terminal-count incremented counter is read-out from the instant that the MSb goes high until the MSb goes low (during which time the MSb-incremented counter chain is settling), while the MSb-incremented counter is read-out from the instant that the MSb goes low until the MSb goes high (during which time the terminal-count incremented counter chain is settling).

By utilizing the technique of the invention, delays associated with the settling of ripple-through or slow counters are avoided, and are instead limited to those associated with memory writing and multiplexer switching. This permits a very rapid counter response time even though very slow speed counters may be used. As the response time of the invention is not limited by its slow-speed counters, the capacity of these counters may be increased without a degradation of counter performance.

OBJECTS OF THE INVENTION

It is an object of the invention to provide an improved counting device.

Another object of the invention is to provide a high-precision counting device for measuring the time-of-occurrence of randomly- and rapidly-occurring events.

Yet a further object of the invention is to provide a counter that does not incur cumulative counting errors due to counter interruption.

Yet another object of the invention is to provide a high-precision counter for measuring the time-of-occurrence of randomly- and rapidly-occurring events, that is relatively inexpensive, consumes minimal power, takes up a relatively small board space and that provides minimal interfacing requirements for peripheral or downstream logic.

These and other objects, advantages, and novel features of the invention will become apparent from the following description when taken in conjunction with the accompanied drawings.

DESCRIPTION OF THE PREFERRED EMBODIMENT

In the ensuing description, all of the described functions are implemented through positive logic devices i.e. devices having an active state that is high. Upon further examination of the invention one skilled in the art will realize that, depending upon design, logic devices of different convention may be used.

Figure 1:
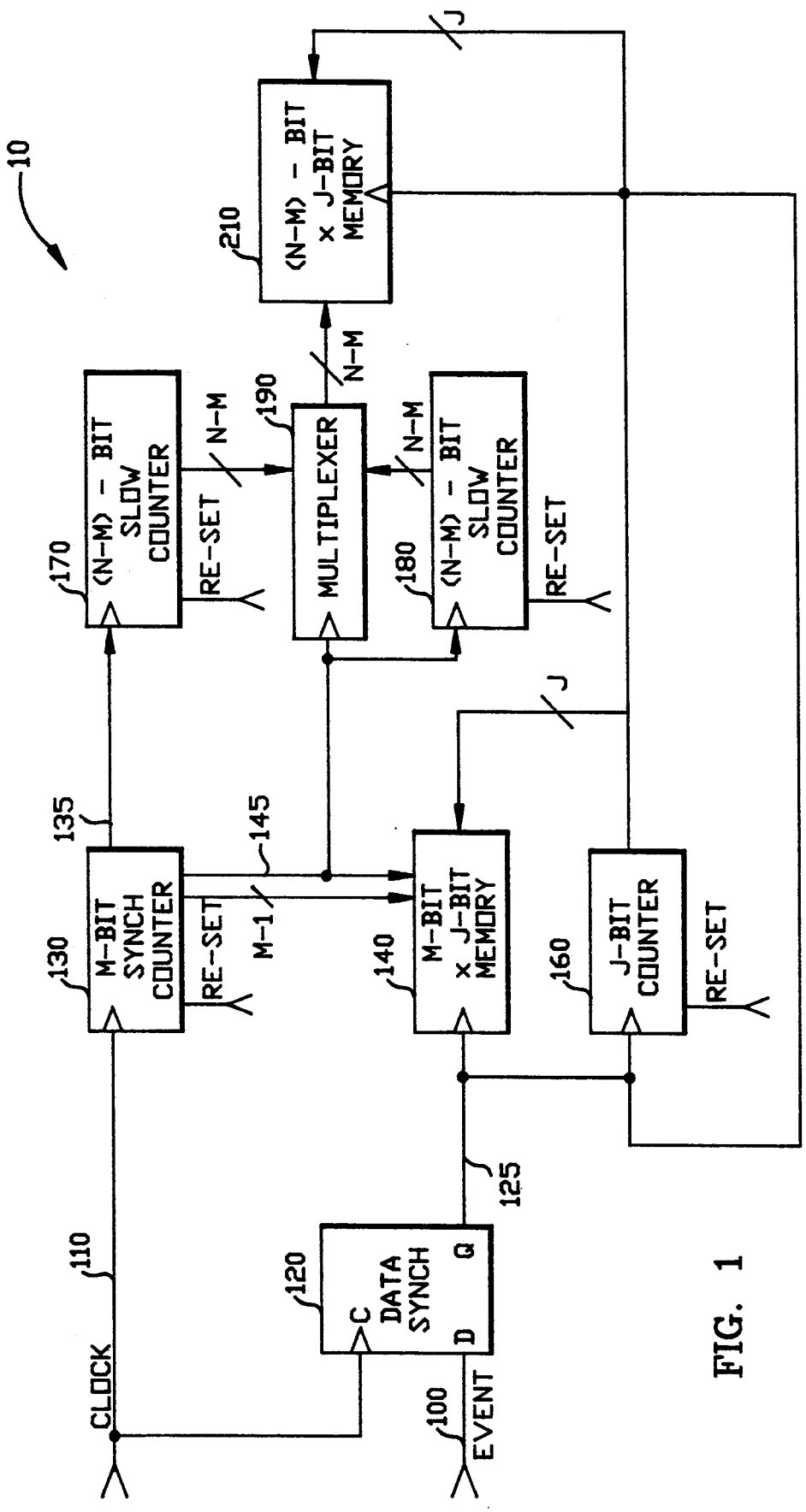
FIG. 1 is a simplified, over-all block diagram of an uninterrupted, enhanced-rate, event-time recorder with mixed-speed counter modules as per the invention.

Referring now to FIG. 1 an event-time recorder 10 according to the invention is shown. According to this invention, an "event" signal on line 100 is initially synchronized with a clock signal on line 110 using a conventional D-type flip-flop (D-FF) data synchronizer 120. The synchronized data signal Q from synchronizer 120 serves as a strobe signal to read-out the contents of an M-bit synchronous or fast counter 130. The contents of this counter are read into an M-bit×J-bit memory device 140, capturing the lowest M-bits of counter 130. The Q strobe signal is also used to increment a J-bit counter 160 which serves as a pointer for memory device 140, i.e. it generates an address at which an event time is to be stored. Thus, J-bit counter 160 also functions to record the number of events that have occurred.

Terminal count (TC) pulse 135 out of M-bit synchronous counter 130 is used to increment an (N-M)-bit slow-speed counter 170. Those skilled in the art will realize, however, that with minimal design change the carry-out signal-pulse of counter 130 could be used to perform this function. Most significant bit (MSb) 145 of synchronous counter 130 is used to serve two functions: (i) at its leading edge, the MSb serves to pre-increment an (N-M)-bit counter 180 and (ii) switch the output of multiplexer 190 from (N-M) counter 180 (the selected input of multiplexer 190 when the MSb is low) to (N-M) counter 170. These functions occur when the MSb transitions from low to high, as will be more clearly explained.

Since MSb 145 goes low only at the trailing edge of terminal count pulse 135 of high-speed synchronous counter 130 (when slow-speed counter 170 should be incremented) the count in pre-incremented slow-speed counter 180 will be correct. When MSb 145 goes high, which will result in slow-speed counter 180's count being high by one count, multiplexer 190's input is again switched back to slow-speed counter 170 to provide an accurate count read-out. This count read-out is stored in (N-M)-bit×J-bit memory 210 which uses counter 160 as an address pointer.

Figure 2:
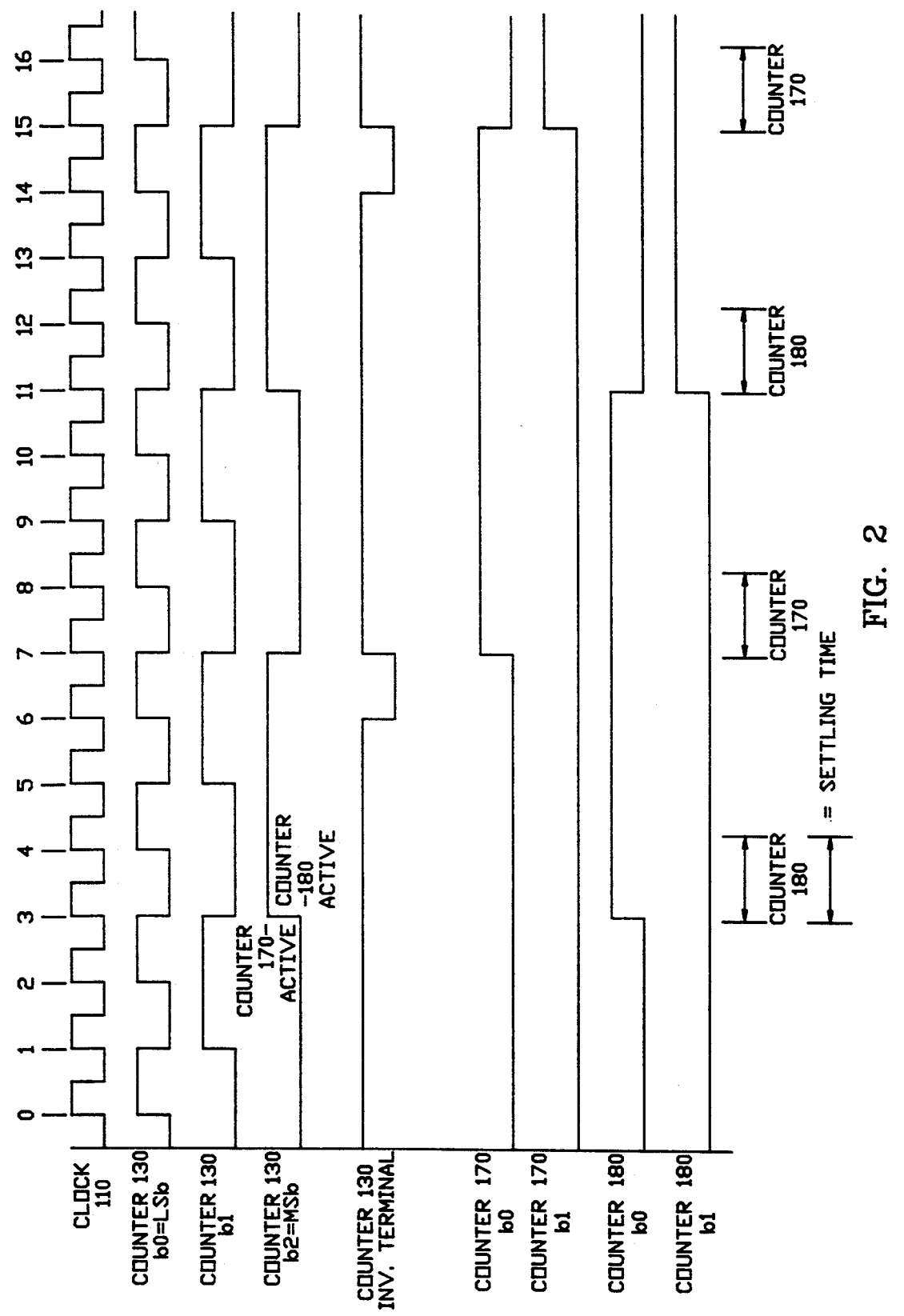
FIG. 2 is a timing diagram corresponding to the over-all block diagram of the invention shown in FIG. 1.

Referring now to FIG. 2 a timing scheme according to a representative embodiment of the invention will be discussed. For simplicity, representative high-speed synchronous counter 130 of FIG. 1 is of three bits. Similarly, for simplicity, representative slow speed counters 170 and 180 are constructed of two bits. Of course, these counters may have different bit capacities depending upon user desires.

Counter 130's bits are identified as b0, b1 and b2 for its first, second and third bits, respectively. The bits of counters 170 and 180 are identified as a b0 and a b1 for their first and second bits, respectively. Thus, the previously referred-to quantity M equals 3 and the previously referred-to quantity N equals 5. The quantity N-M therefor equals 2.

At the top of FIG. 2 a pulse train for clock 110 is described. Beneath this are the bit state sequences for each of counter 130's three bits as well as the inverted terminal count pulse of this high-speed M-bit synchronous counter. As described earlier, the most significant bit (MSb) of counter 130, b2, is used to perform two functions: (i) that of pre-incrementing (N-M)-bit counter 180 as well as (ii) that of switching the input of multiplexer 190 to (N-M) counter 170 when the MSb equals 1 (or to (N-M) counter 180 when the MSb equals 0).

Also shown in FIG. 2 are the bit state sequences for slow-speed counters 170 and 180. Initially (prior to time t=0), all of the counters are reset ("set" meaning setting a bit high or "1", "reset" meaning setting a bit low or "0"). For the implementation described, all counters are incremented at the rising edge of a clock pulse.

The clock pulse at t=0 increments counter 130 to 1 (base 10), i.e. the first bit, which is identified as b0, is set. The next pulse, at t=1 increments counter 130 to 2 (base 10), i.e. b0 is reset and b1 is set. Thus, the state of the counter chain is now 00 010 (least significant binary digit, b0, is 0, and the next least significant binary digit is 1).

At t=2 the counter chain is incremented to 3, the binary representation of which is 00 011. This count representation corresponds to the count state of counter 130 in conjunction with counter 170 as well as the count state of counter 130 in conjunction with counter 180.

The state of the counters following t=3 is significant to this invention. At the beginning of this time period there is an incrementation to a value of 4 (base 10), the binary representation of which is 00 100. If the two high-order bits are given by slow-counter 170, then the concatenated state of counters 130 and 170 represents an accurate count such as that taken by a single five bit counter. However, the state of slow-counter 180 following $t=3$, i.e. $b0=1$ and $b1=0$ or 01, is incorrect and the concatenated state of counters 130 and 180 represents an inaccurate count. This is because b2, the most significant bit of counter 130, is used as a mechanism to effectuate a count in counter 180.

Thus, throughout the entire interval from $t=0$ to $t=3$, the correct over-all count can be as specified by the concatenation of the counts from counters 130 and 180. But at $t=3$, as noted, the state of counter 180 becomes an erroneous representation of the two high-order bits of the clock pulse count. Counter 180 will continue to portray an erroneous representation of the pulse count until clock period $t=7$ is reached.

At the beginning of time period $t=6$, all three bits of counter 130 are set, resulting in the re-setting of the inverted terminal count (TC) output of counter 130. This count is known as the terminal count of counter 130 because it is the last count which can be represented by counter 130 before it rolls over into an all-0 state.

At $t=7$ the trailing (rising) edge of the inverted TC pulse sets b0 of counter 170. Note that b0 of counter 170 behaves exactly as a fourth bit (b3) of counter 130 would have behaved if counter 130 had four bits instead of three. Hence, b0 of counter 170 can function as an accurate "extension" of counter 130. Similarly, b1 of counter 170 corresponds to a fifth bit "b4" of counter 130 if counter 130 were a five-bit counter. Counter 170 can thereby fully serve as an accurate "count" extension of counter 130.

However, it may be seen that when b2, the most significant bit of counter 130, is low, counter 180 also becomes an accurate count extension of counter 130.

Bit b2 of counter 130 can thus be used with multiplexer 190 of FIG. 1 to control the switching of multiplexer 190 between counters 170 and 180. The multiplexer is controlled by b2 of counter 130 so that when b2 is high, the output of multiplexer 190 is from counter 170 whereas when b2 is low the output of multiplexer 190 is from counter 180. In either case, an accurate count is achieved.

Since, to the extent discussed to this point, counter 170 alone can apparently yield an accurate representation of the two least significant bits of the pulse count, the above scheme must be explained to show its usefulness.

An object of an event time recorder is to record the time of occurrence of an event, such as the leading edge of a positive pulse, to within one clock pulse. Thus, if a leading edge occurred between time periods starting at $t=4$ and $t=5$, the count (time) taken for this event should be 5.

This is possible for fast counter 130 provided only that the leading edge of the clock-synchronized event pulse (which serves as a strobe to read the state of counter 130 into memory 140) is time positioned by delays so as to fall at an appropriate time between $t=4$ and $t=5$ (which position will of course be correct for all other event pulses). One of these delays is inherent in data synchronizer 120 and the other must be purposely placed between data synchronizer 120 and memory 140.

Figure 3:
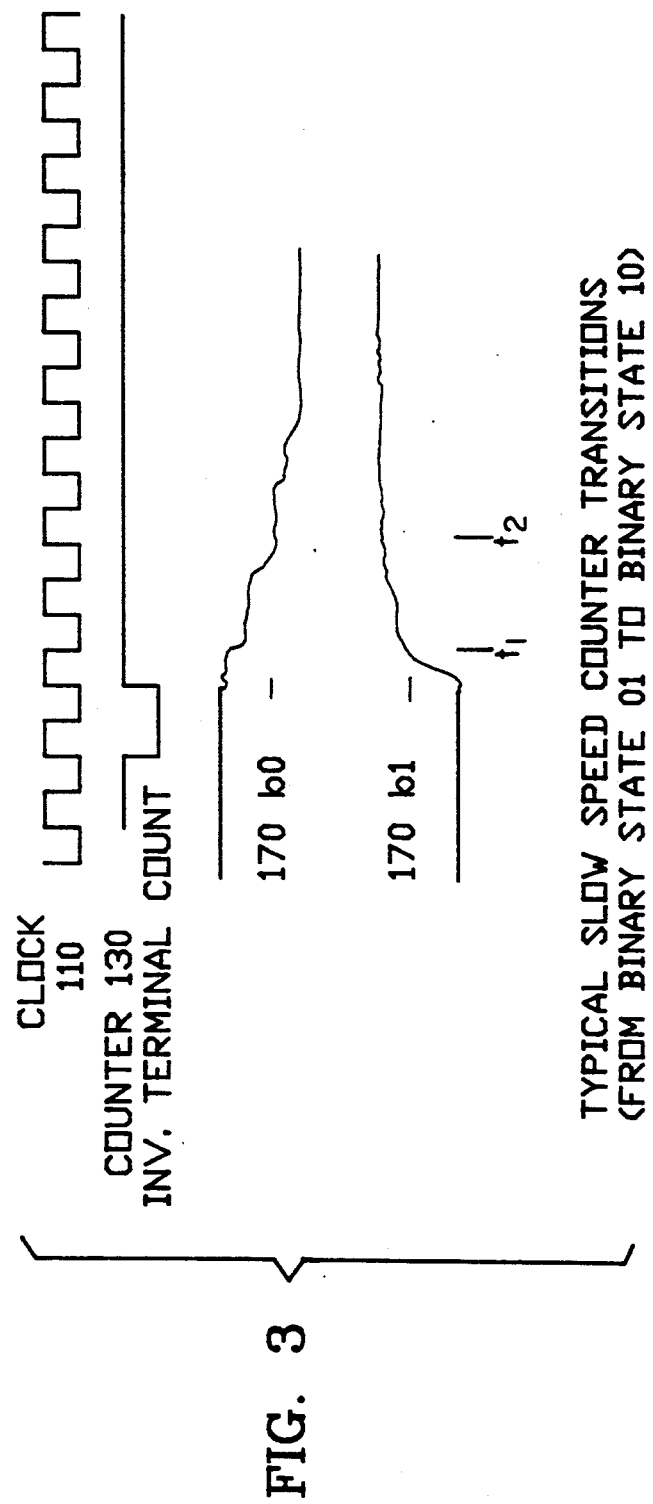
FIG. 3 illustrates typical slow-speed counter, count transition settling characteristics.

Yet, for a period of time beginning with the trailing edge of the TC, the state of counter 170 does not change in the idealized fashion as characterized by instantaneous transitions between high and low levels, such as shown in FIG. 2. Instead, these transitions are more like those depicted in FIG. 3: slow and dissimilar over a time scale of a few clock pulses. Even using a counter output mid-point as a threshold, if the state of counter 170 is read out at time $t_1$, it would read binary 11 as both b0 and b1 lie above the threshold. It would not be until about time $t_2$ that the state would be read correctly as binary 10.

Referring again to FIG. 2, at the bottom of this figure the transitioning or settling times of slow-counter 170, associated with its clocking by the inverted TC pulse following clock pulses $t=7$ and $t=15$ are shown. Also shown are the settling times for slow-counter 180 following clock pulses $t=3$ and $t=11$. Thus the utility of the disclosed counter read-out configuration may be seen: first counter 180 is read from $t=0$ to $t=3$, then counter 170 is read from $t=3$ to $t=7$ (during a phase in which 180 is settling and therefore erroneous), then counter 180 is read from $t=7$ to $t=11$ (during a phase in which counter 170 is settling), and finally counter 170 is read again this time from $t=11$ to $t=15$ (where counter 180 is once again erroneous and settling).

It is now necessary to consider additional details of this embodiment of the invention. Multiplexer 190 does not instantaneously switch inputs from slow-speed counter 180 to slow-speed counter 170 as the MSb of counter 130 transitions from low to high. Also, the strobing of count data into memories 140 and 210 must be accurately timed to ensure the capture of valid data. The over-all block diagram to accomplish this timing is shown in FIG. 4, in which delay functions 150, 165, 175 and 200 are illustrated.

Figure 4:
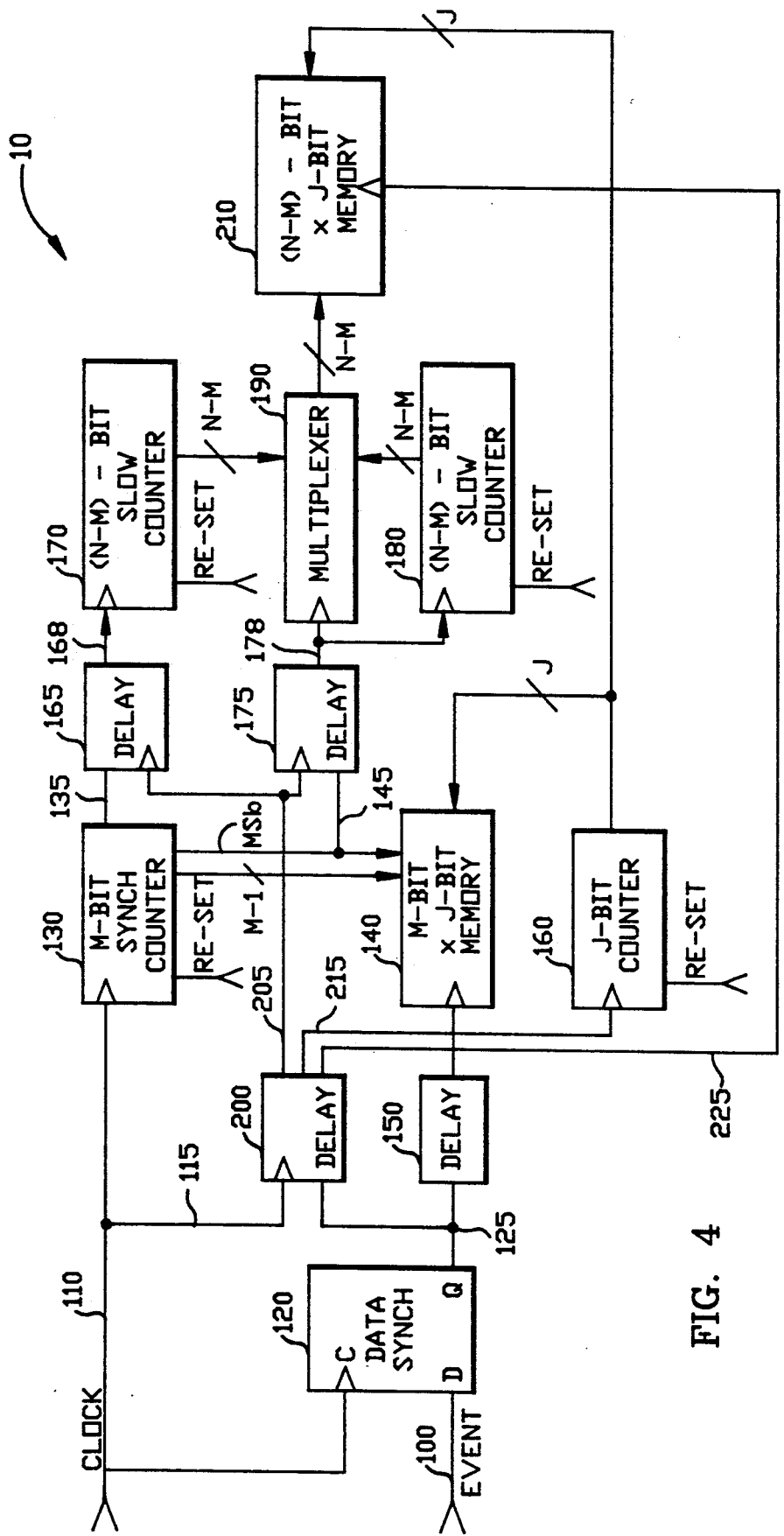
FIG. 4 is an over-all block diagram of the invention incorporating delay functions utilized with one embodiment of the invention.

Referring to FIG. 4, delay 150 is the simplest to discuss. The leading edge of the event on line 100 will be clocked through to the Q output of data synchronizer 120; this transition will always occur at some fixed time relative to the clock transitions (caused primarily by delay within data synchronizer 120 and by interconnecting line length delays).

That is, for a given physical implementation, the clocked event pulse transition might always occur 0.4 nsec after the leading edge clock transitions shown in FIG. 2. For example, if the leading edge of an event occurs at $t=1.75$ nsec, and the clock transition occurs at $t=2$ nsec, the corresponding rising transition on line 125 will occur at $t=2.4$ nsec.

In addition, memory 140 will have a set-up time device specification. For example, this set-up time might be specified as 1.5 nsec, i.e., the M-bit outputs of fast-counter 130 must be valid and stable at the input to memory 140 for 1.5 nsec before strobing.

Because of the described delays, delay 150 in line 125 will need to be of a 1.1 (1.5 minus 0.4) nsec duration. Those skilled in the art will realize that there are a number of ways of implementing this delay, such as by fixed or programmable delay integrated circuits, actual wire delay lines, etc.

Referring once again to FIG. 4, delays 165 and 175 are required because of the settling time requirements for multiplexer 190 i.e., the multiplexer does not instantaneously switch inputs from counter 180 to counter 170. Therefore, multiplexer 190's output cannot be strobed into memory 210 until a certain minimum length of time has elapsed after the input has been switched i.e., after a transition of the MSb of fast counter 130, which controls the switching of multiplexer 190.

Figure 5:
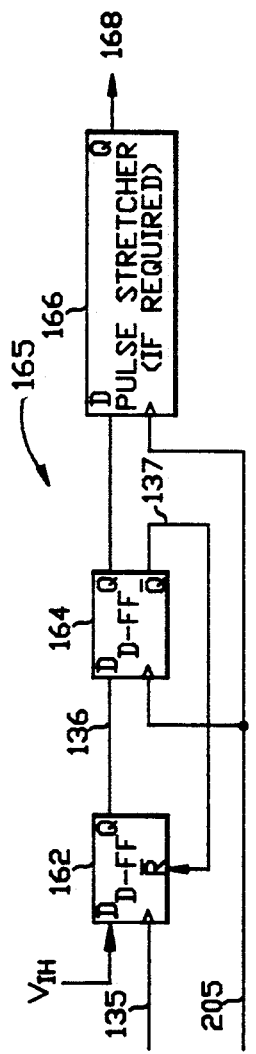
FIG. 5 is a block diagram of logic circuitry used to effectuate a delay in a counter's terminal count pulse according to the invention.
Figure 6:
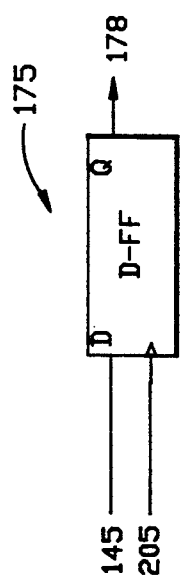
FIG. 6 is a block diagram of logic circuitry used to effectuate a delay in a counter's Most Significant bit (MSb) pulse as is used in the invention.
Figure 7:
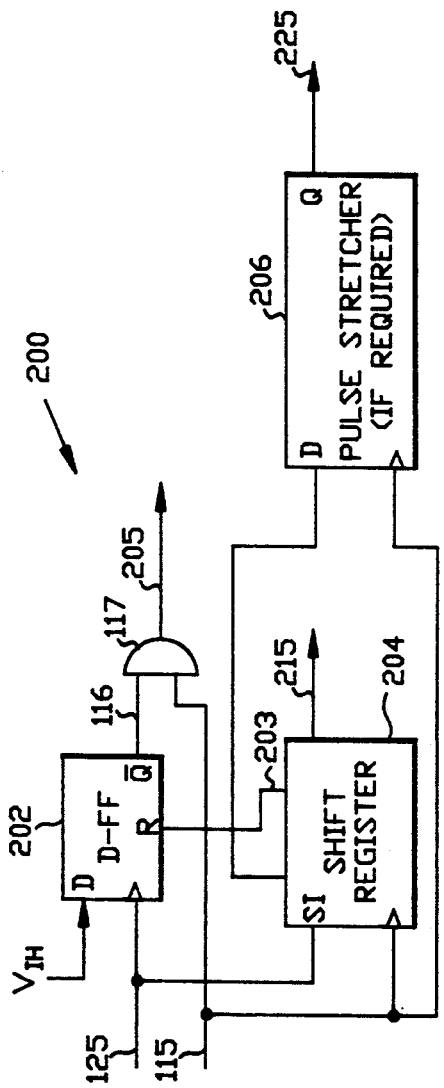
FIG. 7 is a block diagram of logic circuitry used to effectuate a delay of clock pulses sent to the terminal count and MSb delay circuits illustrated in FIGS. 4 and 5, respectively.
Figure 8:
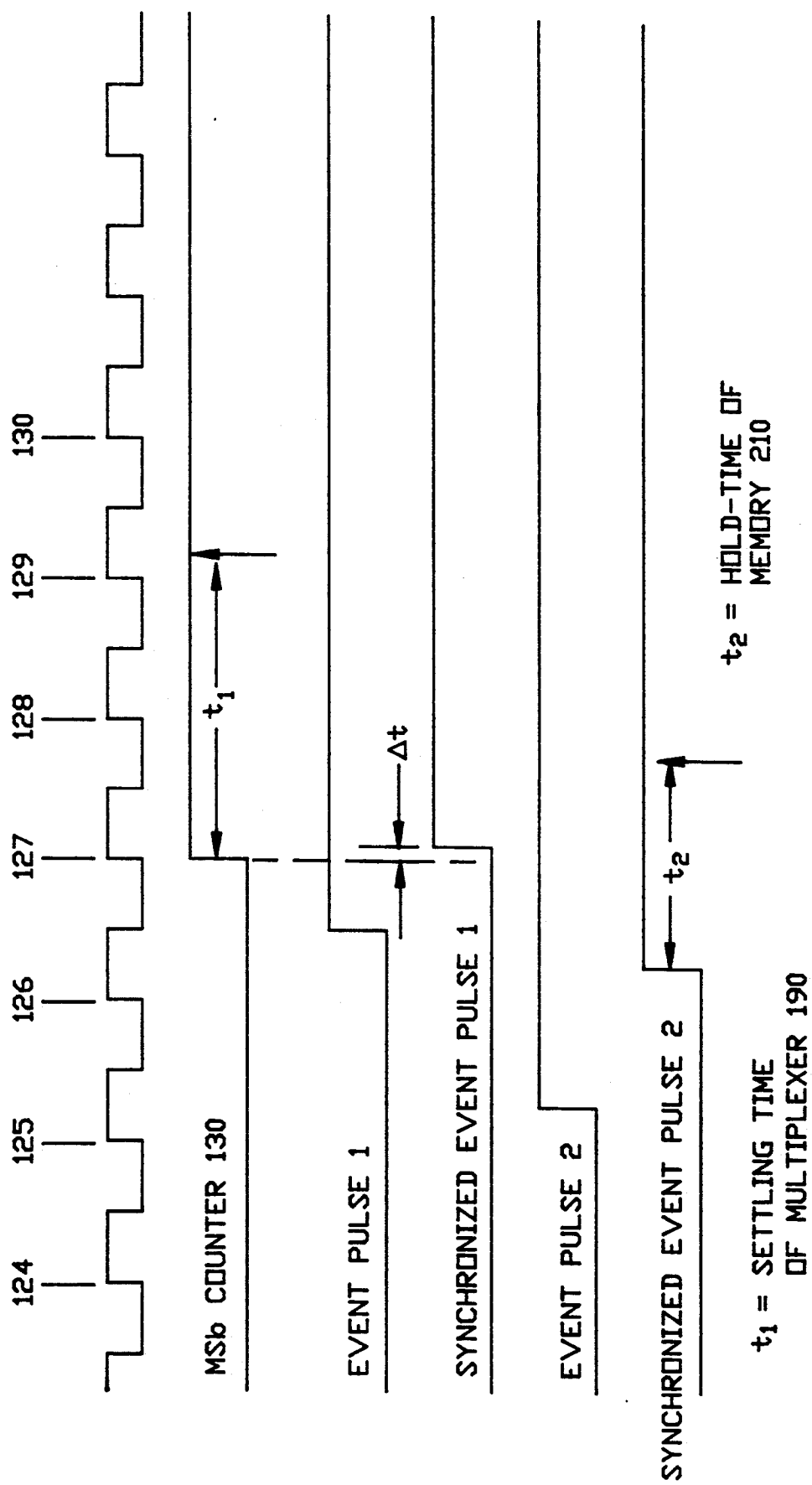
FIG. 8 is a timing diagram corresponding to the delays illustrated in FIGS. 4-6.

Shown in FIGS. 5, 6 and 7 are detailed block diagrams of delays 165, 175 and 200, respectively. The nature of the problems dealt with by these delays can be understood by referring to FIG. 8. Shown at the top of this figure are counter 130 clock pulses for pulses 124 through 131 (again using the convention that the first pulse is 0). For this example, it is assumed that counter 130 is an 8-bit device so that the MSb is set at pulse 127, thereby switching multiplexer 190's input from slow-counter 180 to slow-counter 170. Because of the propagation (or settling) time requirements for counter 130, and set-up time requirements for memory 210, the state of multiplexer 190 cannot be strobed into memory 210 until time $t_1$ after counter 130's MSb.

An event pulse can arrive at any time, including specifically immediately before an MSb transition, as shown. In this instance the original event pulse transition occurs between clock pulses 126 and 127. The clock-synchronized event transition does not occur until just after the first positive-going clock pulse (because of small delays in data synchronizer 120, the event pulse transition will be displaced by $\Delta t$ from the clock pulse transition). Counter 170's state should be strobed into memory 210 through multiplexer 190, but in this instance the strobe should not take place until $t_1$ because multiplexer 190 is settling. Because a synchronized event transition could have taken place one, two or three clock 110 cycles earlier, i.e., an MSb transition could take place between the event transition and the time $t_1$, all clocking affecting counters 170 and 180, and multiplexer 190 should be halted for three clock 110 cycles (this is longer than interval $t_1$ but clocking must be suspended by an integral number of cycles).

In addition, memory device 210 may have a hold time requirement, i.e., the data at its input must be valid and stable for some specified time $t_2$ after strobing or, for this example, 2 clock cycles after the leading edge of the strobe. Thus the general sequence of operations must be to (i) use the synchronized event pulse to suspend clocking (and therefore the state changes) of counters 170, 180 and multiplexer 190 for a number of clock pulses $N(t_1)+N(t_2)$, where $N(t)$ is the rounded-up number of clock pulses represented by t; (ii) strobe the state of multiplexer 190 into memory 210 at $N(t_1)$ clock pulses after the event pulse transition.

The final timing operation required is to increment the J-Bit Counter 160 after the current data has been stored so that a new memory address will be pointed to when new data are to be stored.

These described timing operations are implemented through the circuitry shown in FIGS. 4, 5, 6 and 7.

Figure 9:
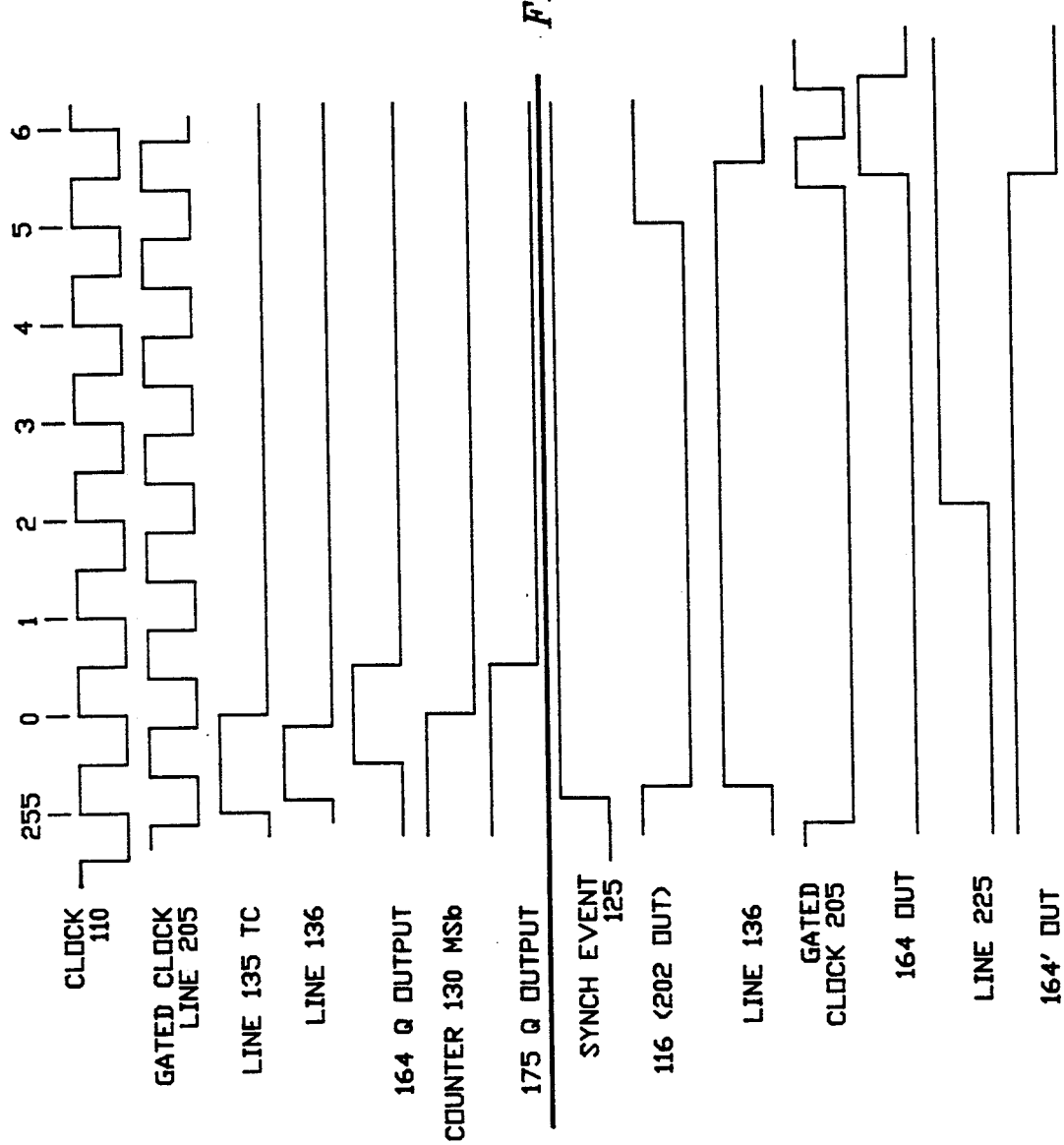
FIG. 9 is a timing diagram shown to facilitate understanding of the delays incorporated in the invention.

Referring to FIGS. 9 and 7, normally D-FF 202 is reset, i.e., the inverted output on line 116 is high thereby allowing clock pulses on line 115 to pass through AND gate 117 to line 205. This gated clock signal is shown below the clock signal at the top of FIG. 9. Because of delays in gate 117 and elsewhere, the gated clock will be shifted by some arbitrary but fixed time with respect to clock 110.

Referring to FIGS. 9 and 5, the leading edge of terminal count (TC) pulse 135 from counter 130 serves to clock a high state from the D input of D-FF 162 to the non-inverted Q output line 136. The next positive-going transition of the gated clock on line 205 then clocks the high D-input state of D-FF 164 to the pulse stretcher 166, which then generates a pulse of adequate duration to serve as a clock pulse for counter 170 in a fashion known to those skilled in the art. At the same time that the Q output of D-FF 164 goes high, the inverted Q output goes low, which resets D-FF 162. On the following gated clock 205 pulse, the low state of D-FF 162's Q output is then clocked to the output of D-FF 164, i.e., D-FF 164 generates a single pulse whose duration is that of the clock period. Referring to FIGS. 9 and 6, similarly, though more simply, the gated pulse 205 of D-FF 175 also clocks out the MSb to multiplexer 190 and counter 180.

For the lower half of FIG. 9, both the terminal pulse on line 135 and counter 130's MSb occur exactly as shown in the upper half of FIG. 9. However, in the lower half of FIG. 9 an event pulse occurs.

Referring to FIGS. 4, 5, 7 and 9, the leading edge of an event pulse on line 125 serves to clock low the inverted Q output on line 116, thereby closing AND gate 117 and inhibiting the passage of clock pulses from line 115 to line 205. As a consequence, the states of counters 170 and 180, and multiplexer 190, are frozen. It is important to note that any terminal count pulse on line 135 from counter 130 will be captured through D-FF 162 which serves as a latch. There is no need to latch the MSb of counter 130 on line 145 because its duration is far longer than the few clock cycles required to successfully accomplish the data strobing to memory 210.

The synchronized event pulse on line 125 is also clocked from output to output of the shift register 215. When it appears on the output to pulse stretcher 206, a pulse of appropriate duration to serve as a write command will be output to memory 210. When the shift-register clocked data appears on line 203 to D-FF 202, this device will be reset, i.e., the inverted Q output will be set high, the Q output will be high, and clock pulses will again be passed through AND gate 117. As shown in FIG. 9, the high state of line 136 is then clocked to the Q output of D-FF 164, and D-FF 162 is reset by the inverted Q output.

Thus the objective of the circuitry is verified. Beginning with the leading edge of an event pulse, the states of slow counters 170 and 180, and multiplexer 190, are frozen until the state of multiplexer 190 can be strobed into memory 210. The clocking of counters 170 and 180, and operation of multiplexer 190 is then resumed, and the address pointer to memories 140 and 210 is then incremented in preparation for the next event pulse.

Referring once again to FIG. 1 those skilled in the art will realize that where rapid clocking is necessary, fast-speed synchronous counter 130 may be of the emitter coupled logic (ECL) type while slow counters 170 and 180 may be of the complementary metal oxides semiconductor (CMOS) type. For example, at a clock frequency of 250 MHz, the time between MSb transitions of an 8-bit counter would be 512 nanoseconds, much longer than the settling time of even a 14 bit ripple-through CMOS used as counters 170 and 180. Alternatively, all counters could be of the same speed if this was considered desirable.

The invention can be configured using either macro counter modules, that is, individual counter integrated circuits, or can be configured as a very-large-scale integrated (VLSI) circuit. Another alternative configuration would be to use (First In First Out) FIFO memories in which the address pointer counter 160 of the invention is integrated into the memories 140 and 210. The following example illustrates this latter alternative.

In this example, low-speed counters 170 and 180 could each be low-power, inexpensive, 14-bit counters such as those manufactured by Harris-RCA under the designation of CD74ACT7060. These counters have a ripple-through time of approximately 95 nanoseconds. The low-speed counters may be combined with four IDT brand 74FCT157CT 4-bit, 2:1 multiplexers that have maximum switching times of 5.2 nanoseconds. Multiplexer 190 would need to have four of these four-bit multiplexers to adequately cover the 14-bit counters.

Memory 210 could be two IDT 7201×15 512×9-bit FIFO memories. To adequately serve the fourteen bit counters, memory 210 requires two IDT 7201s as these are each of nine bits. This combination could record event-pulse times once every 20 nanoseconds compared to a prior art terminal-count driven, counter-settling time inhibited device that could record event pulses every 105 nanoseconds.

An 8-bit high-speed ECL counter such as a Sony CXB1136Q clocked at 200 MHz could be used for high-speed counter 130. If this counter were used, low-speed counter 170 would not require pulse stretcher 166 as the low-speed counter CD74ACT7060 operates with pulse widths as narrow as 4.4 nanoseconds. The terminal count pulse out of counter 130 would, in this instance, be 5 nanoseconds. Thus event times could be recorded to within 5 nanoseconds over durations of up to 20 milliseconds.

An ECL-to-TTL interface and another IDT 7201 memory, used for memory 140, would be required to capture data out of fast-counter 130. Use of the IDT 7201 FIFOs would obviate the need for counter-address 160 as the FIFOs have their own address capability.

Obviously, many modifications and variations of the present invention are possible in light of the above teachings. It is therefore to be understood that within the scope of the appended claims the invention may be practiced other than has been specifically described.

What is claimed is:

1. An N-bit counter apparatus comprising:
   an M-bit low-order counter for generating a count signal and a switch signal;
   a first N-M bit high-order counter incrementable by said count signal;
   a second N-M bit high-order counter incrementable by said switch signal; and
   a switch that is switchable by said switch signal between said first N-M bit high-order counter and said second N-M bit high-order counter.

2. An apparatus according to claim 1 in which said switch is a multiplexer.

3. An apparatus according to claim 2 in which said switch signal is a most-significant-bit of said M-bit low-order counter.

4. An apparatus according to claim 3 in which said count signal is a terminal count signal of said M-bit low-order counter.

5. An apparatus according to claim 3 in which said count signal is a carry-out signal of said M-bit low-order counter.

6. An apparatus according to claim 3 in which said first and second N-M bit high-order counters are slow-counters and in which said M-bit low-order counter is a fast counter.

7. An apparatus according to claim 6 in which said M-bit low-order fast-counter is a synchronous counter.

8. An apparatus according to claim 7 in which said first and second N-M bit high-order slow-counters are ripple-through counters.

9. An N-bit counter apparatus comprising:
   an M-bit low-order fast-counter for generating a count signal and a switch signal;
   a first N-M bit high-order slow-counter incrementable by said count signal;
   a second N-M bit high-order slow-counter incrementable by said switch signal; and
   a switch that is switchable by said switch signal between said first N-M bit high-order slow-counter and said second N-M bit high-order slow-counter.

10. An apparatus according to claim 9 in which said switch is a multiplexer.

11. An apparatus according to claim 10 in which said switch signal is a most-significant-bit of said M-bit low-order counter.

12. An apparatus according to claim 11 in which said count signal is a terminal count signal of said M-bit low-order counter.

13. An apparatus according to claim 11 in which said count signal is a carry-out signal of said M-bit low-order counter.

14. An apparatus according to claim 11 in which said M-bit low-order fast-counter is a synchronous counter.

15. An apparatus according to claim 14 in which said first and second N-M bit high-order slow-counters are ripple-through counters.

16. An N-bit counter apparatus comprising:
   an M-bit low-order fast-counter for generating a count signal and a switch signal;
   a first memory operably coupled to said M-bit low-order fast-counter for receiving a count of said M-bit low-order fast-counter;
   a first N-M bit high-order slow-counter incrementable by said count signal;
   a second N-M bit high-order slow-counter incrementable by said switch signal;
   a switch that is switchable by said switch signal between said first N-M bit high-order slow-counter and said second N-M bit high-order slow-counter; and
   a second memory operably coupled to said switch for receiving a count from said first or second N-M bit high-order slow-counters depending upon which of said N-M bit high-order slow-counters said switch is switched to.

17. An apparatus according to claim 16 in which said switch is a multiplexer.

18. An apparatus according to claim 17 in which said switch signal is a most-significant-bit of said M-bit low-order fast-counter.

19. An apparatus according to claim 18 in which said count signal is a terminal count of said M-bit low-order fast-counter.

20. An apparatus according to claim 18 in which said count signal is a carry-out of said M-bit low-order fast-counter.

21. A method for counting comprising the steps of:
   recording low-order bits on a fast-counter, said fast-counter for generating a switch signal and a count signal;
   storing said low-order bits in a first memory;
   recording high-order bits on a first slow-counter, said first slow-counter being incremented by said count signal from said fast-counter;

recording high-order bits on a second slow-counter, said second slow-counter being incremented by said switch signal when said switch signal undergoes a change in state;

reading out high-order bits through a switch from said first slow-counter or said second slow-counter depending upon said change in state of said switch signal; and storing said high-order bits read out from said switch in a second memory.

* * * * *